United States Patent [19]

Kishi et al.

[11] Patent Number: 4,795,500
[45] Date of Patent: Jan. 3, 1989

[54] PHOTOVOLTAIC DEVICE

[75] Inventors: Yasuo Kishi, Osaka; Hiroshi Inoue, Hyogo; Hiroyuki Tanaka, Osaka, all of Japan

[73] Assignee: Sanyo Electric Co., Ltd., Japan

[21] Appl. No.: 57,021

[22] Filed: Jun. 1, 1987

Related U.S. Application Data

[63] Continuation-in-part of Ser. No. 878,118, Jun. 25, 1986, Pat. No. 4,686,321.

[30] Foreign Application Priority Data

Feb. 9, 1986 [JP] Japan .............................. 62-17334[U]
Jun. 9, 1986 [JP] Japan .............................. 61-87352[U]
Feb. 9, 1987 [JP] Japan .............................. 62-17335[U]
Apr. 23, 1987 [JP] Japan .............................. 62-61949[U]

[51] Int. Cl.$^4$ ...................... H01L 27/14; H01L 31/04
[52] U.S. Cl. .................................... 136/244; 136/251; 136/256; 136/258

[58] Field of Search ............... 136/251, 256, 258 AM, 136/291, 244

[56] References Cited

U.S. PATENT DOCUMENTS 3,880,633 4/1975 Jordan et al. .................. 65/60.2
3,971,672 7/1976 Lampkin ....................... 136/246
4,686,321 8/1987 Kishi ............................ 136/244

Primary Examiner—Aaron Weisstuch
Attorney, Agent, or Firm—Darby & Darby

[57] ABSTRACT

A photovoltaic device copmrises a transparent insulating substrate, a transparent front electrode layer on the substrate, a semiconductor layer for photoelectric conversion on the front electrode layer, and a metallic back electrode layer on the semiconductor layer, wherein at least the back electrode layer has a plurality of holes for transmission of light.

24 Claims, 4 Drawing Sheets

PHOTOVOLTAIC DEVICE

The present patent application is a continuation-in-part of U.S. patent application Ser. No. 878,118 filed June 25, 1986, now U.S. Pat. No. 4,686,321.

BACKGROUND OF THE INVENTION

1. Field of the Invention

The present invention relates to a photovoltaic device and particularly to a photovoltaic device for partially transmitting incoming light.

2. Description of the Prior Art

Among photovoltaic devices for converting light energy to electric energy, an amorphous silicon solar cell having a large area can be easily manufactured at low cost. Such a solar cell in which a transparent front electrode layer, a photoelectric conversion semiconductor layer, and a metallic back electrode layer are stacked in order on a transparent insulating substrate is disclosed for example in U.S. Pat. No. 4,281,208. According to this patent, incoming light is transmitted to the semiconductor layer through the transparent insulating substrate and the transparent front electrode layer so that the incoming light is absorbed in the semiconductor layer to generate electron-hole pairs contributing to photoelectric conversion. Therefore, it is necessary to transmit the incoming light to the semiconductor layer as efficiently as possible, and for this reason, a front electrode of transparent conductive oxide (TCO) such as $SnO_2$, $In_2O_3$ or a mixture thereof, i.e., ITO is used.

On the other hand, the back electrode does not need to be transparent and accordingly it is formed of a single layer or a multiple layer including a metal layer of such as Al, Ag, TiAg, Ni, Au or Cr having lower sheet resistance compared with TCO.

If a photovoltaic device is used as a solar cell incorporated in a roof or a wall of a house, or a roof of a car, not as a power supply for a small-sized electronic device such as a portable electronic calculator, an electronic watch, or a portable radio, it is sometimes desired that sunlight be partially transmitted to the solar cell. For example, in a sun roof of a car, incoming light is partially intercepted by a mesh-like print pattern for example so that only about 1/10 of the incoming light, not all of it, is transmitted. An example of application of a solar cell to a car is described for example in Japanese Patent Laying-Open Gazette No. 50782/1983 and Japanese Patent Laying-Open Gazette No. 52884/1983.

A solar cell in which not only a front electrode but also a back electrode is formed of ITO so as to utilize light also from the back surface for photoelectric conversion is proposed in "S. 5-5, Problems in Development of Amorphous Si Solar Cells" by Konagai et al in National Convention Report IEE Japan, 1982. Such a solar cell is capable of transmitting light of a wavelength longer than about 650 nm which cannot be absorbed by a semiconductor layer.

However, although such a solar cell has transmissibility, it is necessary to use TCO having high resistance as a back electrode.

SUMMARY OF THE INVENTION

In view of the above described prior art, an object of the present invention is to provide a photovoltaic device having partial transmissibility without using TCO having high resistance as a back electrode.

According to the present invention, a photovoltaic device comprises a transparent insulating substrate, a transparent front electrode layer on the substrate, a semiconductor layer for photoelectric conversion on the front electrode layer, and a metallic back electrode layer on the semiconductor layer, at least the back electrode layer having a plurality of holes for transmission of light.

These objects and other objects, features, aspects and advantages of the present invention will become more apparent from the following detailed description of the present invention when taken in conjunction with the accompanying drawings.

BRIEF DESCRIPTION OF THE DRAWINGS

In the drawings, identical reference characters indicate corresponding portions.

DESCRIPTION OF THE PREFERRED EMBODIMENTS

Figure 1:
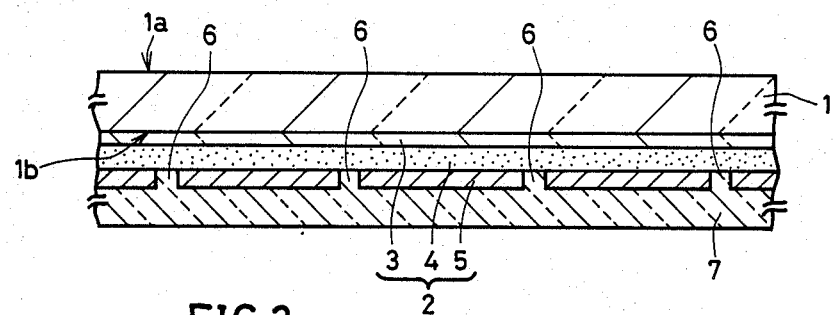
FIG. 1 is a schematic sectional view of a photovoltaic device of a first embodiment of the present invention.
Figure 2:
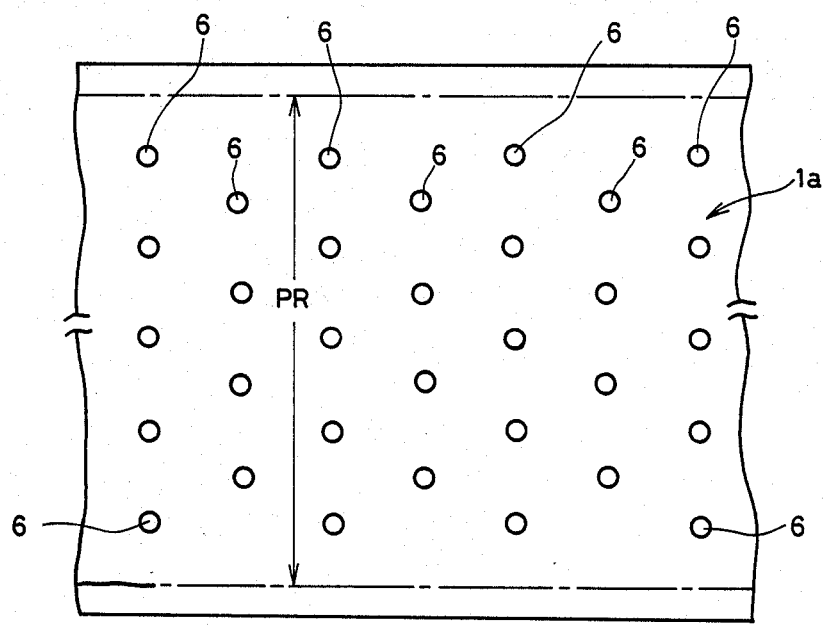
FIG. 2 is a schematic plan view of the photovoltaic device shown in FIG. 1.

FIG. 1 is a schematic sectional view of a photovoltaic device of a see-through type according to a first embodiment of the present invention and FIG. 2 is a schematic plan view of the device shown in FIG. 1. Referring to those figures, incoming light comes from a major surface 1a of a transparent insulating substrate 1 of glass or plastic. A photoelectric conversion element 2 in the form of a film is formed on a light admitting region PR on the other major surface 1b of the substrate 1. The photoelectric conversion element 2 comprises: a front electrode 3 of TCO such as $SnO_2$, $In_2O_3$, or ITO; a photoactive semiconductor layer 4 of an amorphous silicon system such as amorphous silicon, amorphous silicon carbide, or amorphous silicon germanium including a p-i-n or p-n junction parallel to the surface of the film; and a metallic back electrode 5 having low resistance and containing at least a metal layer of Al, Ag, Ti, TiAg, Au, TCO/Ag, TCO/Al, TCO/Au, Al/Ti, Al/TiAg, TCO/Al/Ti, TCO/Al/TiAg, Al/Ti/Al/Ti or the like. Although this photoelectric conversion element is shown as a single element, a plurality of elements are generally connected in series as shown in U.S. Pat. No. 4,281,208.

Holes 6 provided through the metallic back electrode 5 are formed by selective etching by a photolithographic process. Those holes partially transmit the light coming through the substrate 1 to the back surface. Each of those holes 6 may have a circular form of 0.1 to 3 mm in diameter or may have any other form. Since the proportion of the total area of the holes occupied in the light admitting region PR to determines the transmittance factor of light, the proportion is suitably selected according to the purposes for which the photovoltaic device is used. For example, if the photovoltaic device is used in a sun roof for car, the proportion of the total area of the holes 6 is preferably 5 to 30% of the light admitting region PR and more preferably 10 to 20% thereof.

In order to increase the total area of the holes 6, it is preferred for the purpose of uniformly applying light to provide a larger number of small holes 6 rather than to increase the area of each hole.

The back surface of the photoelectric conversion element 2 is sealed with a transparent protective film 7 formed of ethylene vinyl acetate (EVA), epoxy resin, or acrylic resin for example by filling the holes 6 with the film 7.

Thus, the light coming through the transparent substrate 1 is absorbed by the semiconductor layer 4 for the purpose of photoelectric conversion and part of the light is transmitted through the holes 6 for the purpose of lighting the inside of a room or a car.

Although the photovoltaic device of the above described first embodiment provides a sufficient amount of light for the purpose of lighting the room or the car, the transmitted light becomes reddish light because it has a wavelength longer than about 650 nm which is not absorbed by the semiconductor layer 4.

If the holes 6 are extended into the semiconductor layer 4, the reddish color of the transmitted light can be weakened.

Figure 3:
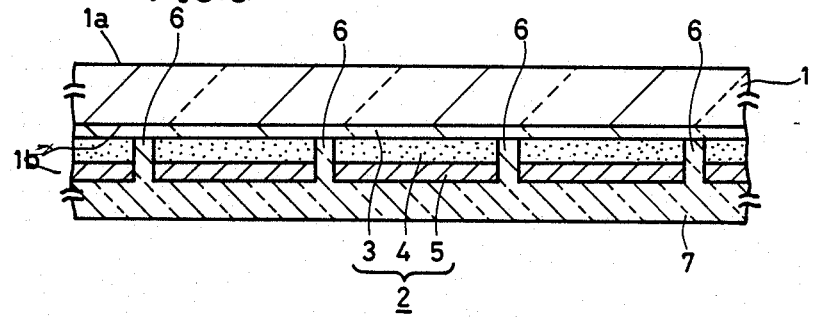
FIG. 3 is a sectional view of a photovoltaic device of a second embodiment.

Referring to FIG. 3, a sectional view of a photovoltaic device of a second embodiment is shown. In this photovoltaic device, the holes 6 extend through the semiconductor layer 4 and transmitted light is natural light not containing any reddish color.

In addition, the holes 6 may also extend through the front electrode 3.

If the photovoltaic device of the above described embodiment is viewed from the back surface thereof, the metallic luster of the metallic back electrode appears conspicuously.

Figure 4:
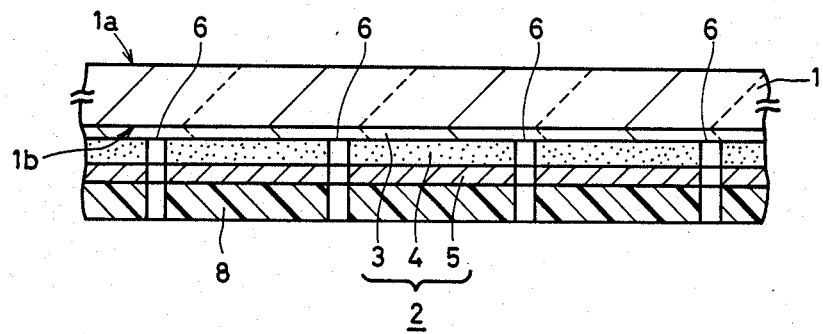
FIG. 4 is a sectional view of a photovoltaic device of a third embodiment.

FIG. 4 shows a sectional view of a photovoltaic device of a third embodiment. In this photovoltaic device, there remains a colored resist layer 8 which was used as a mask at the time of etching the back electrode layer 5 and the semiconductor layer 4 to form holes 6. As a result, the metallic luster of the back electrode layer 5 can be suppressed without intercepting light traveling through the holes 6. As the resist layer 8, a liquid photoresist used in a photolithographic process, a resist where a photosensitive film is deposited in advance on a base film, such as "Neotrock-E" of Nitto Electric Industrial Co., Ltd., or a dry film resist such as "DRF-E15" of Asahi Chemical Industry Co., Ltd. may be used and various colors may be selected according to the purposes for which the device is used. An etching process using a dry film resist is described in detail in Japanese Patent Laying-Open Gazette No. 161883/1984.

As described previously, a practically utilized photovoltaic device is not formed by a single photoelectric conversion element but is formed by an integrated structure in which a plurality of elements are connected in series on a substrate as shown in U.S. Pat. No. 4,281,208.

Figure 5:
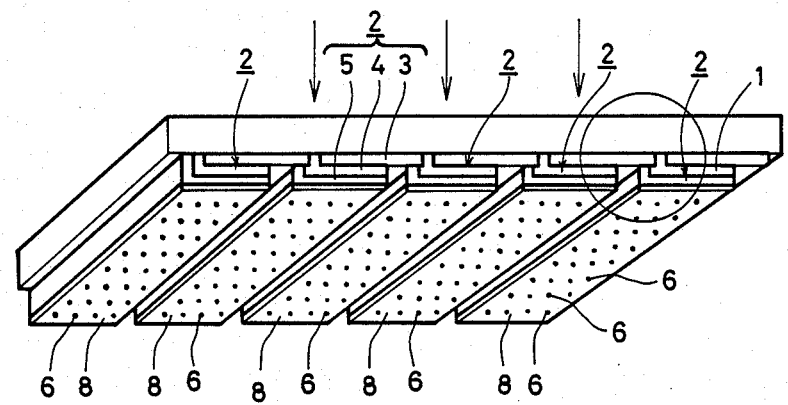
FIG. 5 is a perspective view of the photovoltaic device in FIG. 4 in which photoelectric conversion elements are arrayed in series.
Figure 6:
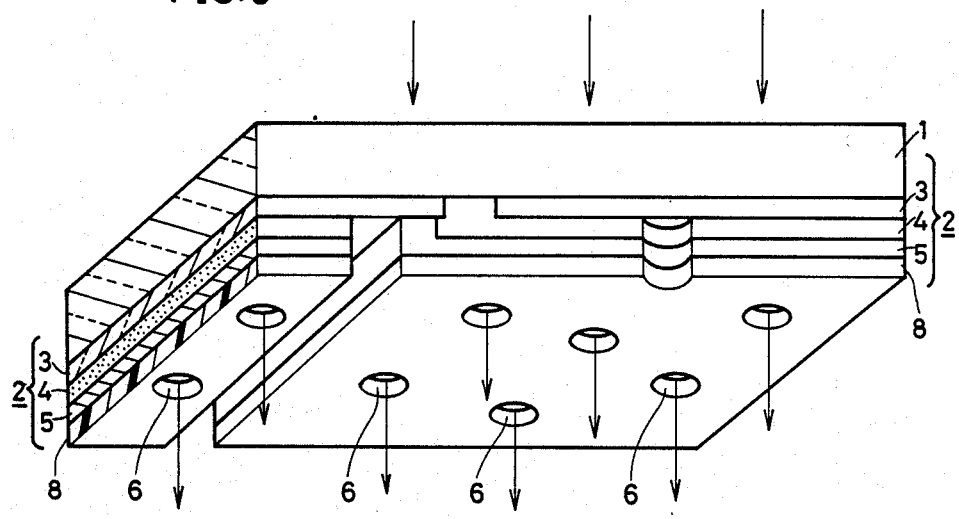
FIG. 6 is an enlarged view of the portion circled in FIG. 5.

FIG. 5 is a perspective view of the photovoltaic device shown in FIG. 4, in which photoelectric conversion elements are integrated. FIG. 6 is an enlarged perspective view of the portion circled in FIG. 5. Referring to FIG. 5, five elements 2 in FIG. 4 are arrayed on a substrate 1 and those elements 2 are electrically connected in series in a manner in which a front electrode 3 of each element 2 is in contact with a back electrode 5 of an adjacent element 2 on the right thereof in the figure.

In such an integrated type photovoltaic device, photolithographic patterning using a resist film is required in order to divide the back electrode layer into the respective elements. However, the patterning for dividing the back electrode into the elements and patterning for forming the holes 6 can be effected simultaneously with good efficiency. In addition, a process for removing the resist layer 8 is not required and accordingly the manufacturing process can be simplified.

If higher luminance is required in a room or a car, it is only necessary in the above described solar cell of the see-through type to increase the proportion of the transmitted light to the incoming light and for this purpose it is necessary to increase a total area of the holes. However, since uniform lighting can not be attained if the area of each hole is increased, it is generally desired to provide a large number of small holes, for example, holes of less than 0.3 mm$^2$ in diameter.

If a large number of small holes are provided, the holes are distributed closely and the distance D between the respective adjacent holes becomes small. Consequently, if the holes are formed in a photolithographic process, portions spacing the holes are sometimes cut to cause adjacent holes to be connected, resulting in an undesirable appearance.

Figure 7:
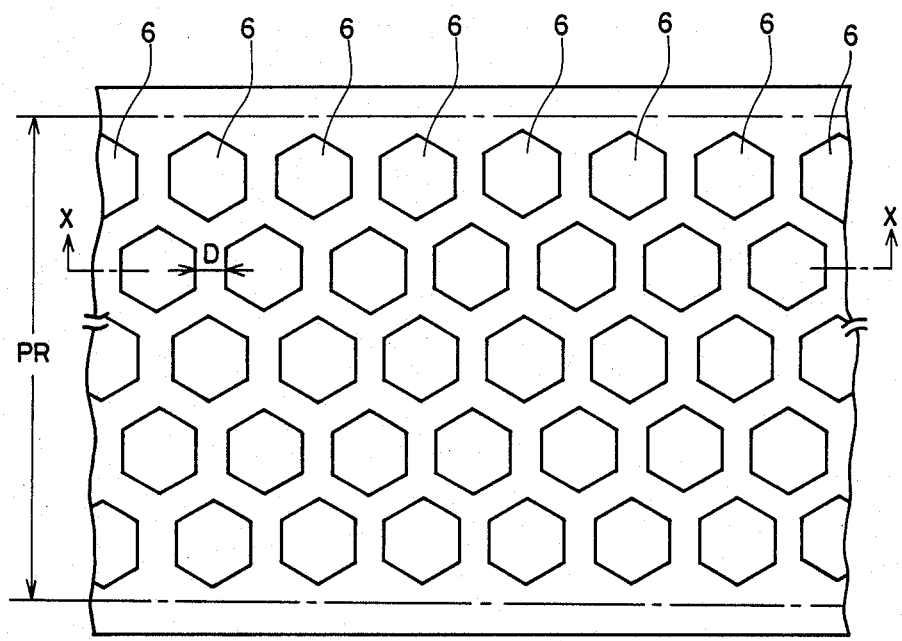
FIG. 7 is a plan view of a photovoltaic device of a fourth embodiment.
Figure 8:
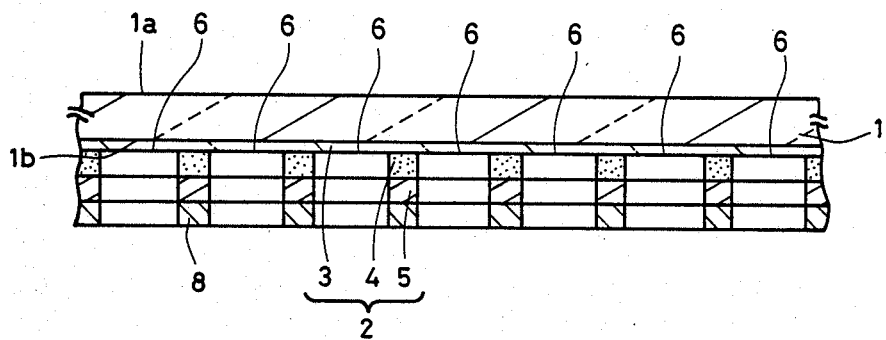
FIG. 8 is a sectional view taken along the line X—X in FIG. 7.

FIG. 7 shows a plan view of a photovoltaic device of a fourth embodiment. FIG. 8 is a sectional view taken along the line X—X in FIG. 7. In this embodiment, holes 6 each have a regular hexagonal form having a small area of 0.01 mm$^2$ to several mm$^2$ and those holes 6 are arrayed in a honeycomb-like pattern. In this case, adjacent holes 6 are in a relation in which opposed sides of the respective holes are parallel. More specifically, the distance D between the respective adjacent holes is constant over the whole region and it never decreases nor increases locally as in the case of circular holes. Accordingly, the amount of transmitted light can be maximized without any adjacent holes 6 being connected.

Figure 9:
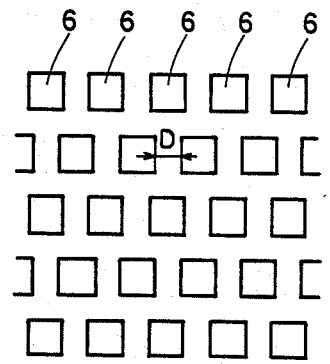
FIG. 9 is a plan view of a photovoltaic device of a fifth embodiment.

FIG. 9 shows an example of a zigzag arrangement of square holes. The distance D between the respective adjacent holes is also constant in this case over the whole region.

From the description of FIGS. 2, 7 and 9, it will be appreciated that holes of various shapes will work effectively in the present invention. Circular, rectangular and hexagonal holes have been described. Those skilled in the art will appreciate that holes of other polygonal shapes, for example triangular holes, will work equally well.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A photovoltaic device comprising:
a transparent insulating substrate,
a transparent front electrode layer on said substrate, a semiconductor layer for photoelectric conversion on said front electrode layer, and a metallic back electrode layer on said semiconductor layer, at least said back electrode layer having a plurality of holes therethrough positioned and dimensioned to permit transmission of light.

2. A photovoltaic device in accordance with claim 1, wherein said holes extend into said semiconductor layer.

3. A photovoltaic device in accordance with claim 2, wherein said holes extend into said front electrode layer.

4. A photovoltaic device in accordance with claim 1, wherein a resist layer used as a mask in an etching process to form said holes remains on said back electrode layer.

5. A photovoltaic device in accordance with claim 1, wherein said holes each have a polygonal form and opposed sides of the respective adjacent holes are parallel.

6. A photovoltaic device in accordance with claim 5, wherein said holes each have a hexagonal form and are arrayed in a honeycomb pattern.

7. A photovoltaic device in accordance with claim 5, wherein said holes each have a square form and are arrayed in a zigzag pattern.

8. A photovoltaic device in accordance with claim 5, wherein said holes each have a triangular form.

9. A photovoltaic device comprising:
a transparent insulating substrate,
a transparent front electrode layer on said substrate,
a semiconductor layer for photovoltaic conversion on said front electrode layer, and
a metallic back electrode layer on said semiconductor layer,
wherein at least said black electrode layer has a plurality of through holes for transmission of light therethrough and said holes occupy more than 5% of the entire area of said back electrode layer.

10. A photovoltaic device in accordance with claim 9, wherein said holes extend into said semiconductor layer.

11. A photovoltaic device in accordance with claim 10, wherein said holes extend into said front electrode layer.

12. A phtotvoltaic device in accordance with claim 9, wherein a resist layer used as a mask in an etching process to form said holes remains on said back electrode layer.

13. A photovoltaic device in accordance with claim 9, wherein said holes each have a polygonal form and opposed sides of the respective adjacent holes are parallel.

14. A photovoltaic device in accordance with claim 13, wherein said holes each have a hexagonal form and are arrayed in a honeycomb pattern.

15. A photovoltaic device in accordance with claim 13, wherein said holes each have a square from and are arrayed in a zigzag pattern.

16. A photovoltaic device in accordance with claim 13, wherein said holes each have a triangular form.

17. A photovoltaic device comprising a plurality of photovoltaic cells in series connection on a transparent insulating substrate, each cell including
a respective transparent front electrode layer region on said substrate,
a respective semiconductor layer region for photoelectric conversion on said respective front electrode layer region, and
a respective metallic back electrode layer region on said respective semiconductor layer region,
wherein each of said back electrode layer regions is not only separated by a narrow spacing from neighboring ones for electrical isolation but is also electrically connected to the front electrode layer region of a neighboring one of said cells for making said series connection, and at least each of said back electrode layer regions has a plurality of holes for transmission of light.

18. A photovoltaic device in accordance with claim 17, wherein said holes extend into the respective semiconductor layer.

19. A photovoltaic device in accordance with claim 18, wherein said holes extend into the respective front electrod layer.

20. A photovoltaic device in accordance with claim 17, wherein a resist layer used as a mask in an etching process to form said holes remains on said back electrode layer.

21. A photovoltaic device in accordance with claim 17, wherein said holes each have a polygonal form and opposed sides of the respective adjacent holes are parallel.

22. A photovoltaic device in accordance with claim 21, wherein said holes each have a hexagonal form and are arrayed in a honeycomb pattern.

23. A photovoltaic device in accordance with claim 21, wherein said holes each have a square from and are arrayed in a zigzag pattern.

24. A photovoltaic device in accordance with claim 21, wherein said holes each have a triangular form.

* * * * *